(12) United States Patent
Lin et al.

(10) Patent No.: US 9,558,958 B2
(45) Date of Patent: Jan. 31, 2017

(54) SEMICONDUCTOR DEVICE AND METHOD OF FORMING SACRIFICIAL PROTECTIVE LAYER TO PROTECT SEMICONDUCTOR DIE EDGE DURING SINGULATION

(71) Applicant: STATS ChipPAC, Ltd., Singapore (SG)

(72) Inventors: Yaojian Lin, Singapore (SG); Kang Chen, Singapore (SG); Jianmin Fang, Singapore (SG); Xia Feng, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/494,508

(22) Filed: Sep. 23, 2014

(65) Prior Publication Data

US 2015/0008597 A1    Jan. 8, 2015

Related U.S. Application Data

(60) Continuation of application No. 13/446,664, filed on Apr. 13, 2012, now Pat. No. 8,907,476, which is a (Continued)

(51) Int. Cl.
*H01L 21/00* (2006.01)
*H01L 21/3105* (2006.01)
(Continued)

(52) U.S. Cl.
CPC ......... *H01L 21/31051* (2013.01); *H01L 21/56* (2013.01); *H01L 21/768* (2013.01);
(Continued)

(58) Field of Classification Search
CPC .... H01L 24/96; H01L 21/31051; H01L 21/78; H01L 23/49816; H01L 23/5389; H01L 24/19
See application file for complete search history.

(56) References Cited

U.S. PATENT DOCUMENTS

| 4,894,115 A | 1/1990 | Eichelberger et al. |
| 5,157,001 A | 10/1992 | Sakuma |

(Continued)

FOREIGN PATENT DOCUMENTS

| CN | 1246731 A | 3/2000 |
| CN | 101192550 A | 6/2008 |

(Continued)

*Primary Examiner* — Richard Booth
(74) *Attorney, Agent, or Firm* — Robert D. Atkins; Patent Law Group: Atkins and Associates, P.C.

(57) ABSTRACT

A semiconductor wafer contains a plurality of semiconductor die separated by a saw street. An insulating layer is formed over the semiconductor wafer. A protective layer is formed over the insulating layer including an edge of the semiconductor die along the saw street. The protective layer covers an entire surface of the semiconductor wafer. Alternatively, an opening is formed in the protective layer over the saw street. The insulating layer has a non-planar surface and the protective layer has a planar surface. The semiconductor wafer is singulated through the protective layer and saw street to separate the semiconductor die while protecting the edge of the semiconductor die. Leading with the protective layer, the semiconductor die is mounted to a carrier. An encapsulant is deposited over the semiconductor die and carrier. The carrier and protective layer are removed. A build-up interconnect structure is formed over the semiconductor die and encapsulant.

25 Claims, 13 Drawing Sheets

Related U.S. Application Data division of application No. 13/029,936, filed on Feb. 17, 2011, now Pat. No. 8,183,095.

(60) Provisional application No. 61/313,208, filed on Mar. 12, 2010.

(51) Int. Cl.

| | | |
|---|---|---|
| *H01L 21/78* | (2006.01) | |
| *H01L 23/498* | (2006.01) | |
| *H01L 23/538* | (2006.01) | |
| *H01L 23/00* | (2006.01) | |
| *H01L 21/56* | (2006.01) | |
| *H01L 21/768* | (2006.01) | |
| *H01L 23/31* | (2006.01) | |

(52) U.S. Cl.
CPC .......... *H01L 21/78* (2013.01); *H01L 23/3107* (2013.01); *H01L 23/49816* (2013.01); *H01L 23/5389* (2013.01); *H01L 24/19* (2013.01); H01L 21/568 (2013.01); H01L 2224/04105 (2013.01); H01L 2224/12105 (2013.01); H01L 2224/20 (2013.01); H01L 2224/94 (2013.01); H01L 2924/01004 (2013.01); H01L 2924/014 (2013.01); H01L 2924/01006 (2013.01); H01L 2924/01013 (2013.01); H01L 2924/01019 (2013.01); H01L 2924/01029 (2013.01); H01L 2924/01047 (2013.01); H01L 2924/01049 (2013.01); H01L 2924/01073 (2013.01); H01L 2924/01078 (2013.01); H01L 2924/01079 (2013.01); H01L 2924/01082 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/14 (2013.01); H01L 2924/15311 (2013.01); H01L 2924/181 (2013.01); H01L 2924/18162 (2013.01)

(56) References Cited

U.S. PATENT DOCUMENTS

| | | | |
|---|---|---|---|
| 5,161,093 A | 11/1992 | Gorczyca et al. | |
| 5,250,843 A | 10/1993 | Eichelberger | |
| 5,309,026 A | 5/1994 | Matsumoto | |
| 5,353,498 A | 10/1994 | Fillion et al. | |
| 5,527,741 A | 6/1996 | Cole et al. | |
| 5,703,400 A | 12/1997 | Wojnarowski et al. | |
| 5,814,193 A | 9/1998 | Crowe | |
| 5,841,193 A | 11/1998 | Eichelberger | |
| 5,866,952 A | 2/1999 | Wojnarowski et al. | |
| 6,025,995 A | 2/2000 | Marcinkiewicz | |
| 6,028,364 A | 2/2000 | Ogino et al. | |
| 6,110,773 A | 8/2000 | Lee | |
| 6,168,966 B1 | 1/2001 | Fan et al. | |
| 6,187,615 B1 | 2/2001 | Kim et al. | |
| 6,197,613 B1 | 3/2001 | Kung et al. | |
| 6,271,469 B1 | 8/2001 | Ma et al. | |
| 6,423,571 B2 | 7/2002 | Ogino et al. | |
| 7,008,822 B2 | 3/2006 | Bolken et al. | |
| 7,165,316 B2 | 1/2007 | Fjelstad | |
| 7,189,596 B1 | 3/2007 | Mu et al. | |
| 7,192,807 B1 | 3/2007 | Huemoeller et al. | |
| 7,569,427 B2 | 8/2009 | Theuss | |
| 7,598,117 B2 | 10/2009 | Kurita et al. | |
| 7,619,901 B2 | 11/2009 | Eichelberger et al. | |
| 7,642,128 B1 | 1/2010 | Lin et al. | |
| 7,666,709 B1 | 2/2010 | Lin et al. | |
| 7,675,157 B2 | 3/2010 | Liu et al. | |
| 7,767,496 B2 | 8/2010 | Shim et al. | |
| 7,888,238 B2 | 2/2011 | Wakisaka et al. | |
| 7,915,690 B2 | 3/2011 | Shen | |
| 8,012,807 B2 | 9/2011 | Meyer et al. | |
| 8,035,231 B2 | 10/2011 | Kurita et al. | |
| 8,039,303 B2 | 10/2011 | Shim et al. | |
| 8,097,489 B2 | 1/2012 | Pagaila et al. | |
| 8,188,584 B1 | 5/2012 | Berry et al. | |
| 8,258,633 B2 | 9/2012 | Sezi et al. | |
| 2003/0141105 A1 | 7/2003 | Sugaya et al. | |
| 2004/0056344 A1 | 3/2004 | Ogawa et al. | |
| 2004/0110316 A1 | 6/2004 | Ogihara et al. | |
| 2006/0063312 A1 | 3/2006 | Kurita | |
| 2006/0084240 A1 | 4/2006 | Poo et al. | |
| 2007/0178622 A1 | 8/2007 | Liu et al. | |
| 2007/0249153 A1 | 10/2007 | Dong | |
| 2008/0006900 A1 | 1/2008 | Chan et al. | |
| 2008/0012144 A1 | 1/2008 | Meyer et al. | |
| 2008/0054426 A1 | 3/2008 | Ohno et al. | |
| 2008/0090335 A1 | 4/2008 | Morimoto et al. | |
| 2008/0188037 A1 | 8/2008 | Lin | |
| 2008/0217761 A1 | 9/2008 | Yang et al. | |
| 2008/0246126 A1 | 10/2008 | Bowles et al. | |
| 2008/0265383 A1 | 10/2008 | Brunnbauer et al. | |
| 2008/0313894 A1 | 12/2008 | Fillion et al. | |
| 2009/0130840 A1 | 5/2009 | Wang et al. | |
| 2009/0140442 A1 | 6/2009 | Lin | |
| 2009/0146282 A1* | 6/2009 | Tay | H01L 24/96 257/686 |
| 2009/0152715 A1 | 6/2009 | Shim et al. | |
| 2009/0302478 A1* | 12/2009 | Pagaila | H01L 21/568 257/774 |
| 2009/0309212 A1 | 12/2009 | Shim et al. | |
| 2010/0258937 A1 | 10/2010 | Shim et al. | |
| 2011/0095404 A1 | 4/2011 | Yamano et al. | |
| 2011/0114950 A1 | 5/2011 | Huang | |
| 2011/0198762 A1 | 8/2011 | Scanlan | |
| 2011/0221055 A1 | 9/2011 | Lin et al. | |
| 2011/0221057 A1 | 9/2011 | Lin et al. | |
| 2011/0244657 A1 | 10/2011 | Grivna et al. | |
| 2011/0254156 A1 | 10/2011 | Lin | |
| 2011/0256690 A1 | 10/2011 | Huang | |

FOREIGN PATENT DOCUMENTS

| | | |
|---|---|---|
| CN | 101261984 A | 9/2008 |
| CN | 101752273 A | 6/2010 |
| JP | 2004128286 A | 4/2004 |
| JP | 2007184636 A | 7/2007 |
| TW | 522499 B | 3/2003 |
| TW | 200924090 A | 6/2009 |

\* cited by examiner

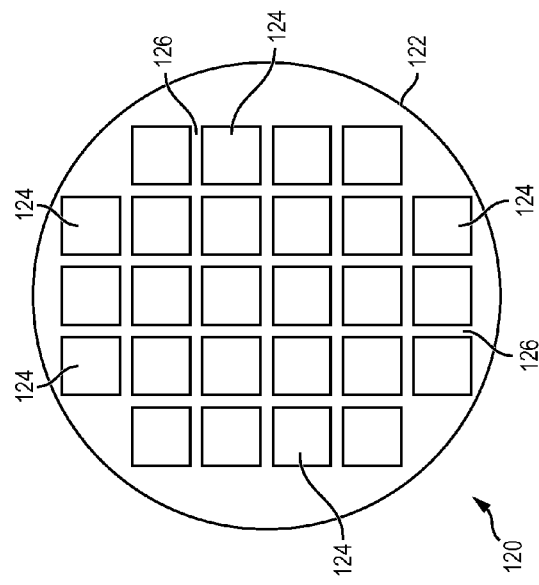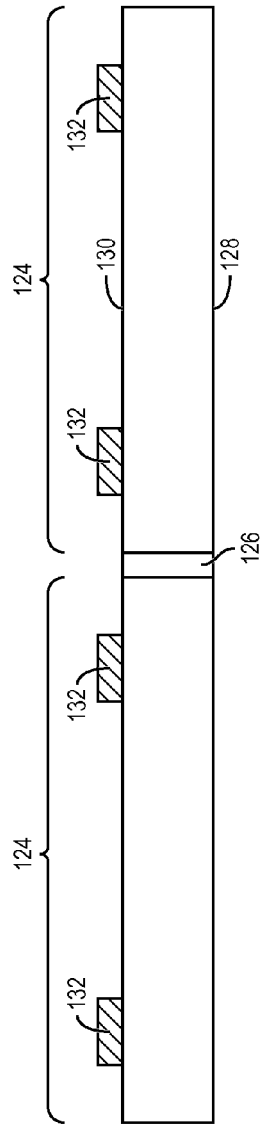

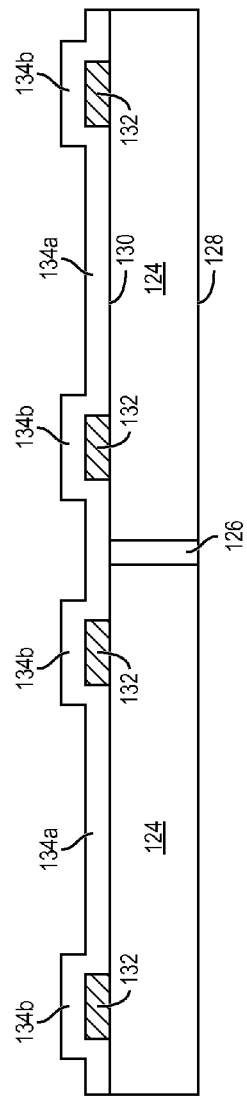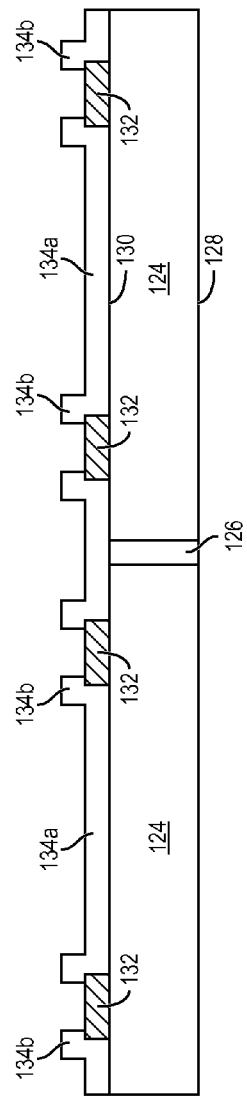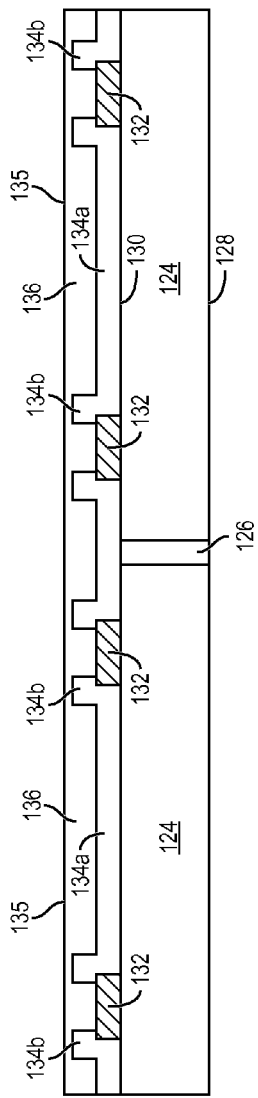
FIG. 3c
FIG. 3d
FIG. 3e

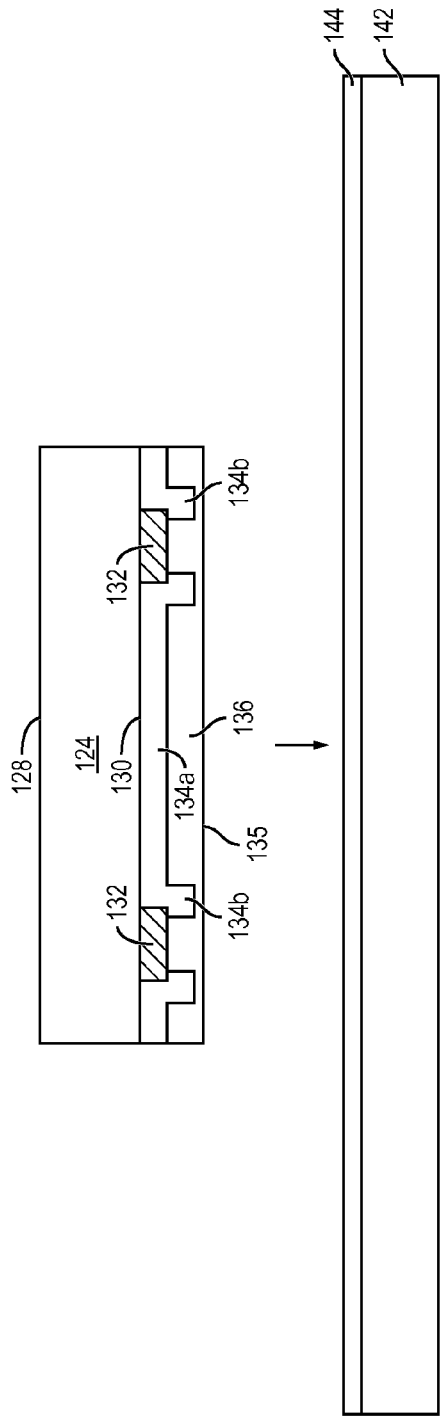
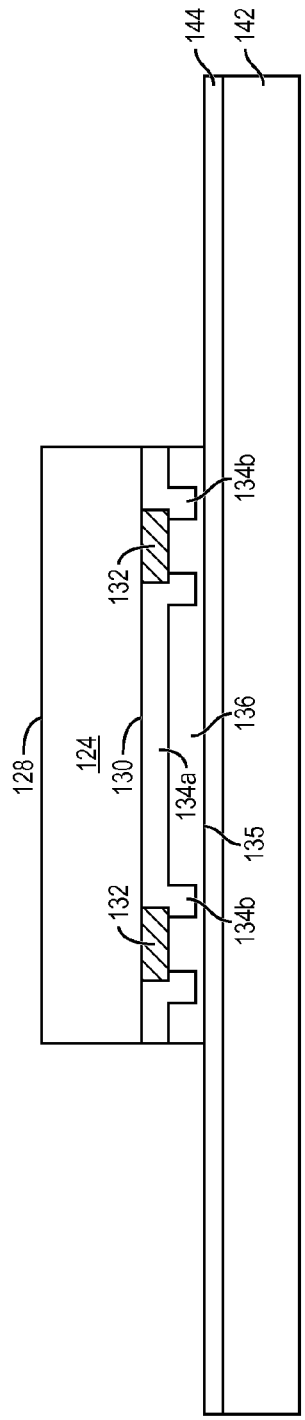
FIG. 4a
FIG. 4b

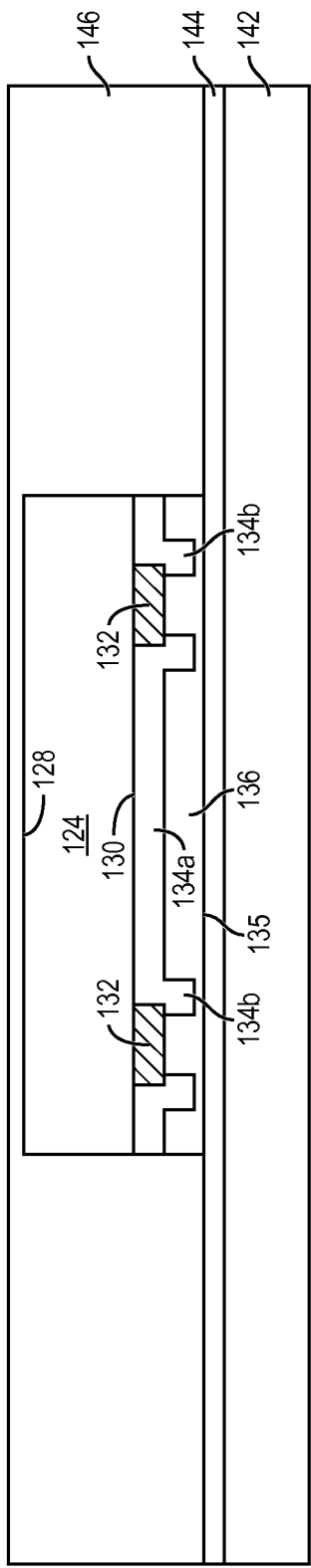
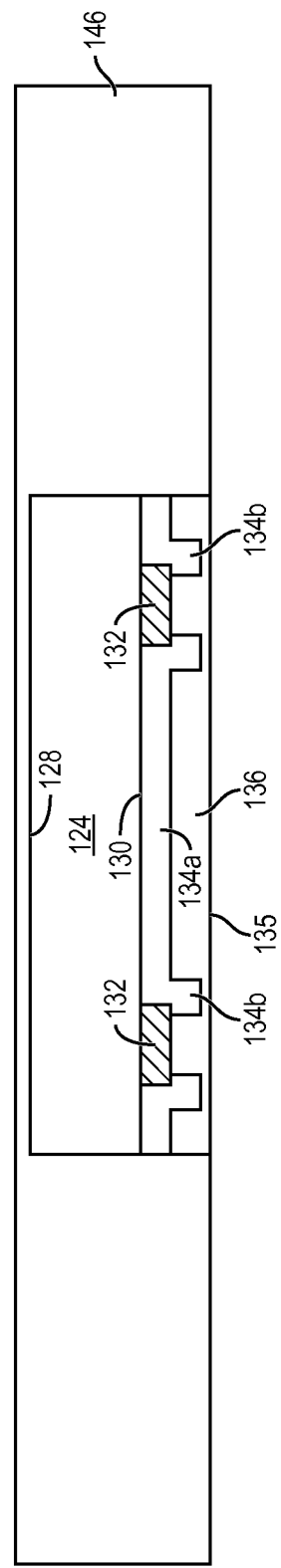
FIG. 4c
FIG. 4d

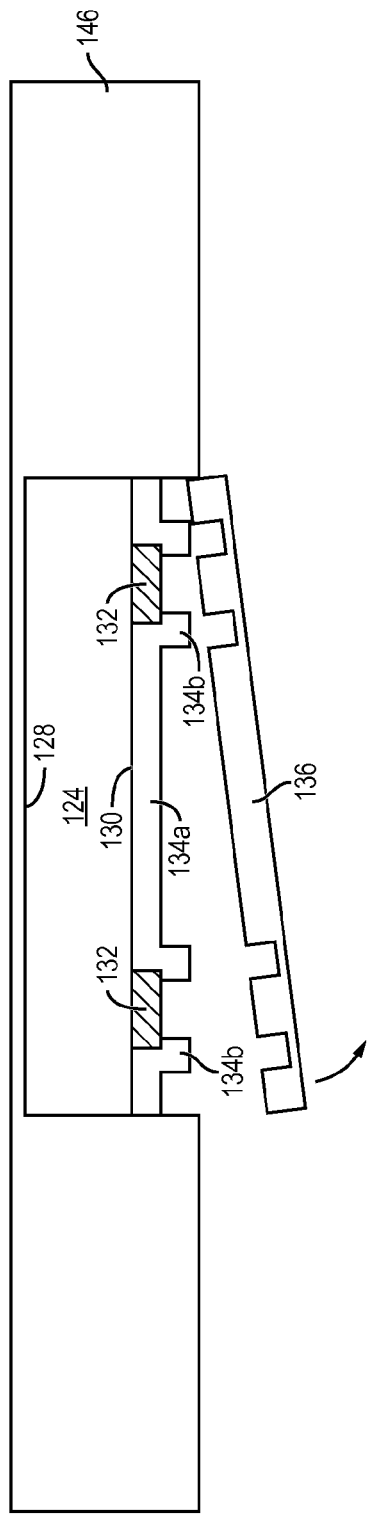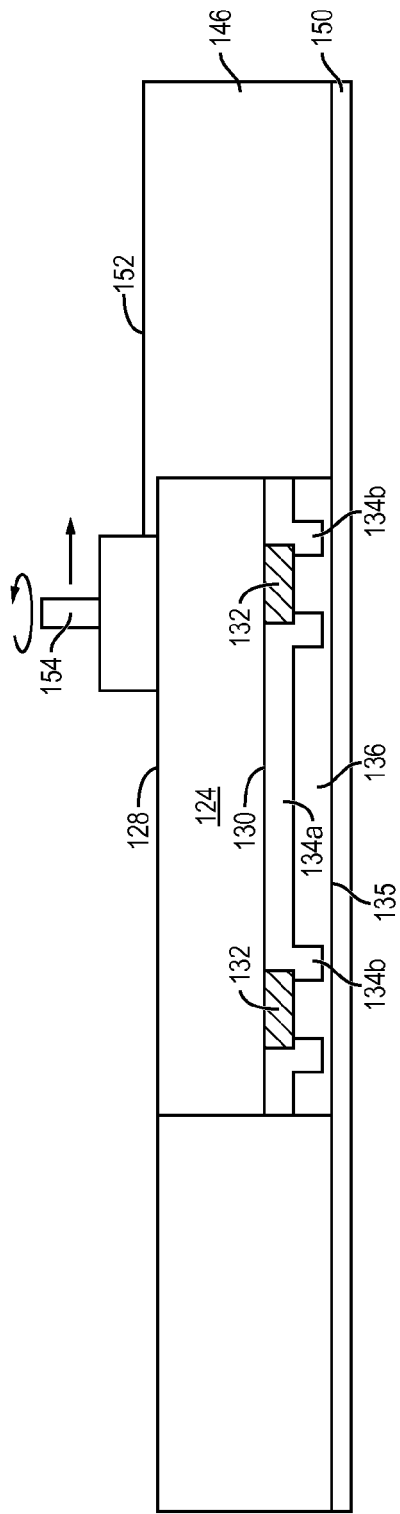

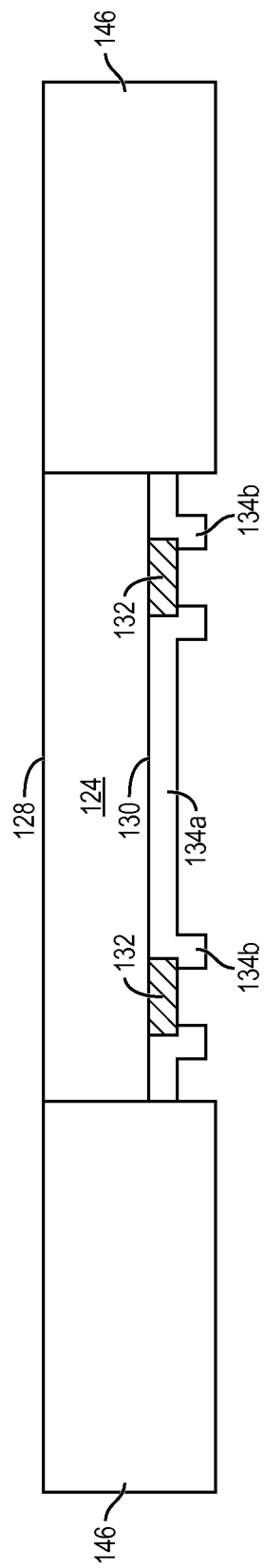
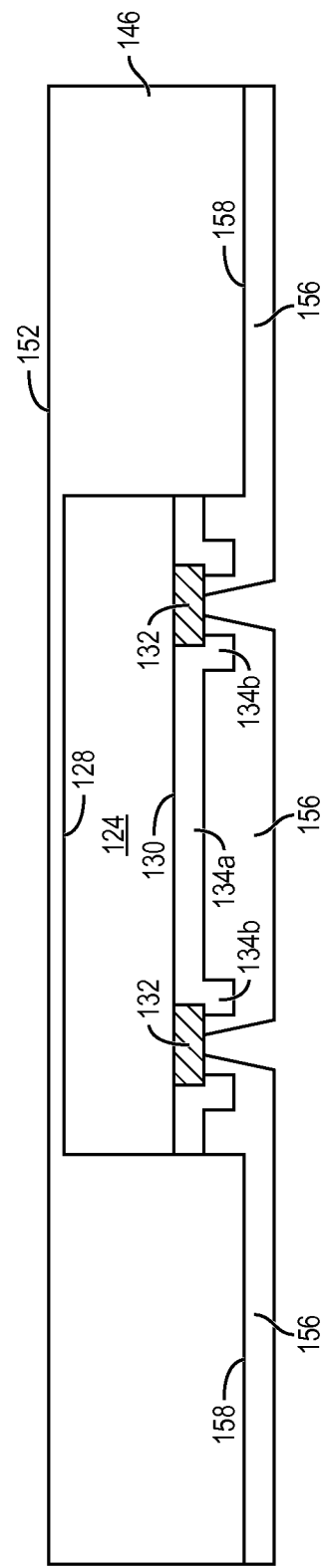

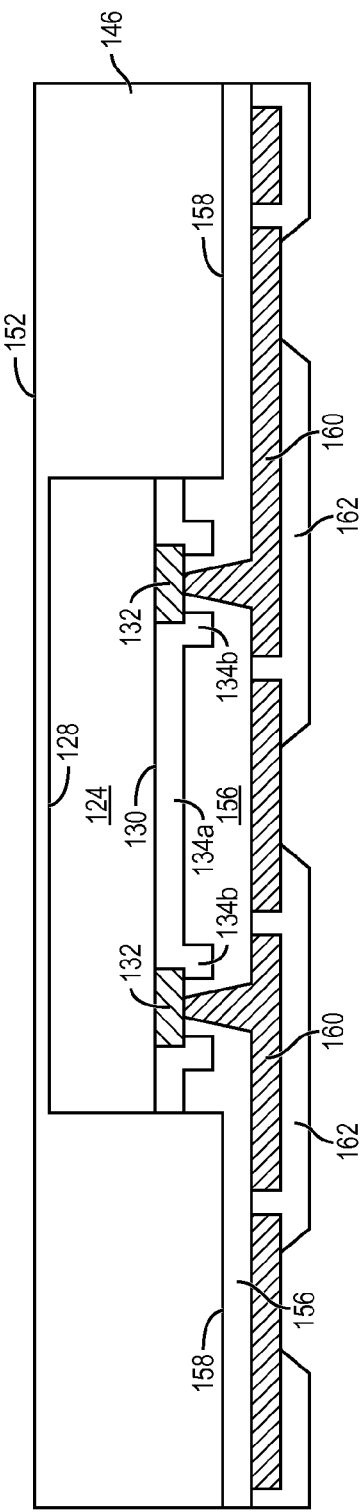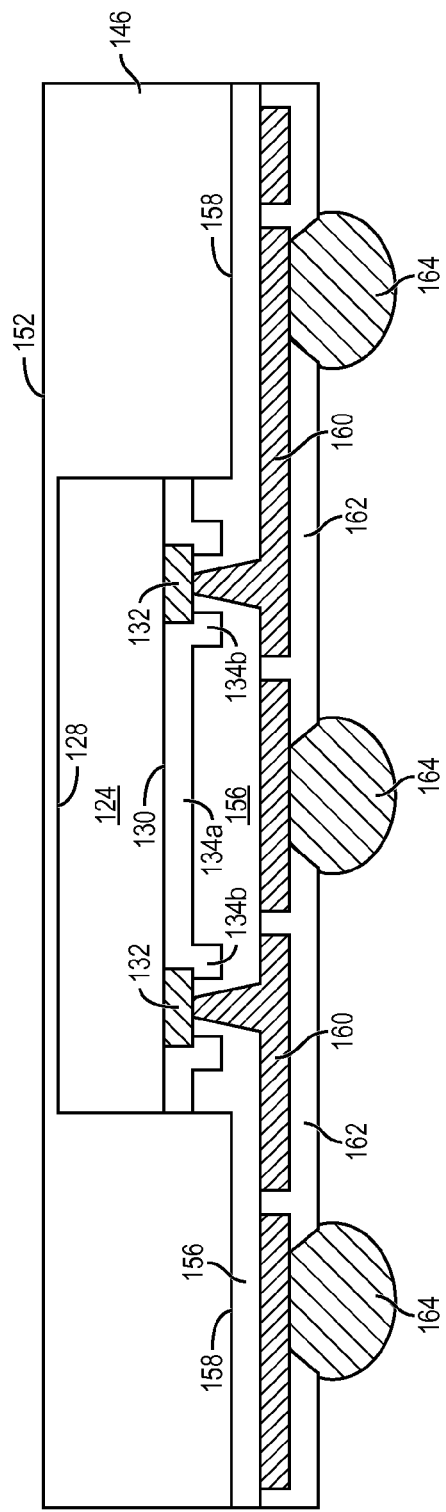

SEMICONDUCTOR DEVICE AND METHOD OF FORMING SACRIFICIAL PROTECTIVE LAYER TO PROTECT SEMICONDUCTOR DIE EDGE DURING SINGULATION

CLAIM TO DOMESTIC PRIORITY

The present application is a continuation of U.S. patent application Ser. No. 13/446,664, now U.S. Pat. No. 8,907,476, filed Apr. 13, 2012, which is a division of U.S. patent application Ser. No. 13/029,936, now U.S. Pat. No. 8,183,095, filed Feb. 17, 2011, which claims the benefit of U.S. Provisional Application No. 61/313,208, filed Mar. 12, 2010, which applications are incorporated herein by reference.

FIELD OF THE INVENTION

The present invention relates in general to semiconductor devices and, more particularly, to a semiconductor device and method of forming a temporary planarization protective layer to protect a semiconductor die edge during singulation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

A semiconductor wafer contains a plurality of semiconductor die or components separated by a saw street. The semiconductor wafer is singulated through the saw street into individual semiconductor die using a saw blade or laser cutting tool. Once singulated, the semiconductor die can be mounted to a temporary carrier in order to form a build-up interconnect structure for a fan-out wafer level chip scale package (Fo-WLCSP). The semiconductor die are subject to chipping and cracking along the die edge or other damage during the singulation process, more specifically by the impact of the spinning saw blade. Metal burring can occur along the saw street during singulation, which can cause electrical shorting when forming the build-up interconnect structure. In situations where the semiconductor die has an uneven or high topology, the adhesion between the die and carrier can be weak leading to defects during the interconnect build-up process.

SUMMARY OF THE INVENTION

A need exists to protect the semiconductor die during singulation and provide a planar surface between the die and carrier during the build-up interconnect process. Accordingly, in one embodiment, the present invention is a method of making a semiconductor device comprising the steps of providing a semiconductor die, forming a protective layer over the semiconductor die, removing the protective layer, and forming an interconnect structure over the semiconductor die.

In another embodiment, the present invention is a method of making a semiconductor device comprising the steps of providing a semiconductor die, forming a protective layer over the semiconductor die, depositing an encapsulant over the semiconductor die, and forming a first cavity in the encapsulant adjacent to the semiconductor die.

In another embodiment, the present invention is a method of making a semiconductor device comprising the steps of providing a semiconductor, forming a protective layer over the semiconductor die, and removing the protective layer.

In another embodiment, the present invention is a semiconductor device comprising a semiconductor die. A protective layer is formed over the semiconductor die. An encapsulant is deposited over the semiconductor die coplanar with the protective layer.

BRIEF DESCRIPTION OF THE DRAWINGS

FIGS. 3a-3i illustrate process of forming a protective layer over an uneven insulating layer to planarize a semiconductor die and protect a die edge during singulation;

FIGS. 4a-4j illustrate a process of forming a WLCSP with the semiconductor die having the sacrificial protective layer to planar uneven surfaces;

DETAILED DESCRIPTION OF THE DRAWINGS

Figure 1:
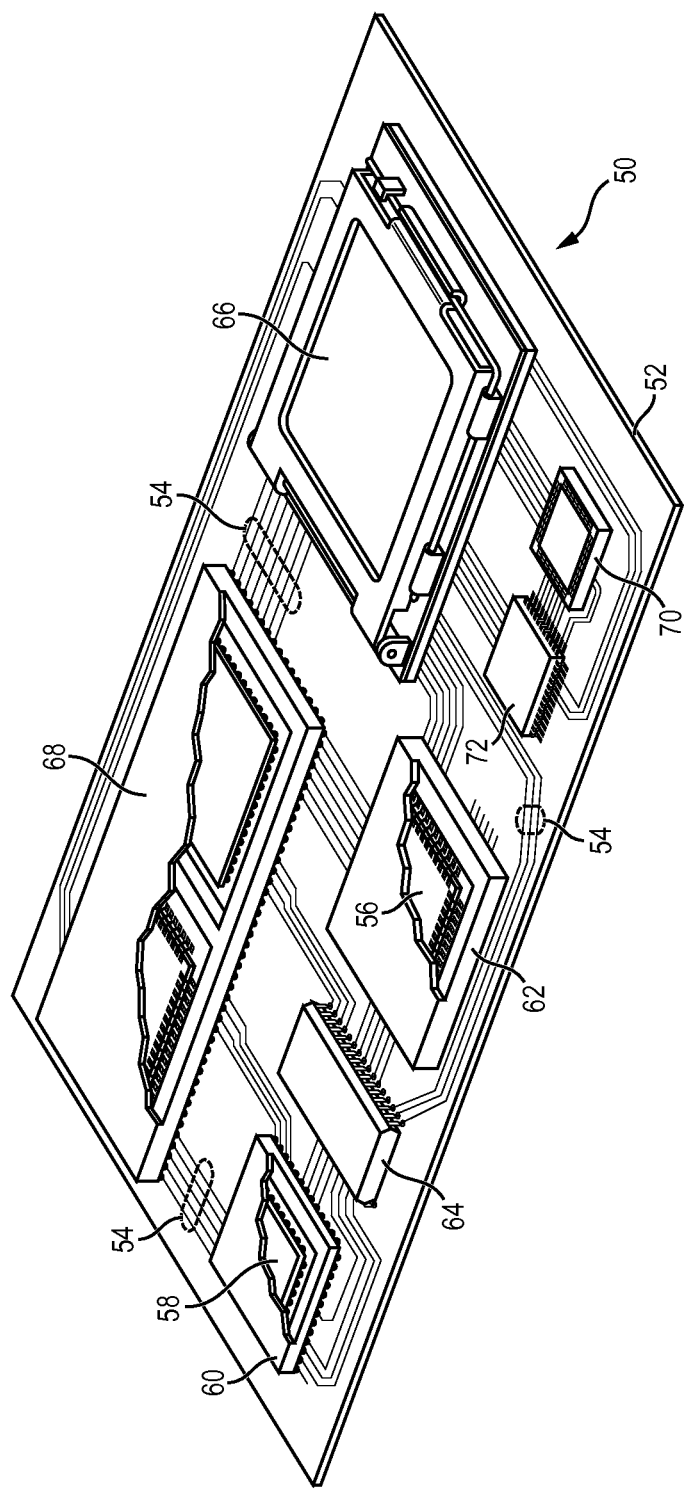
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
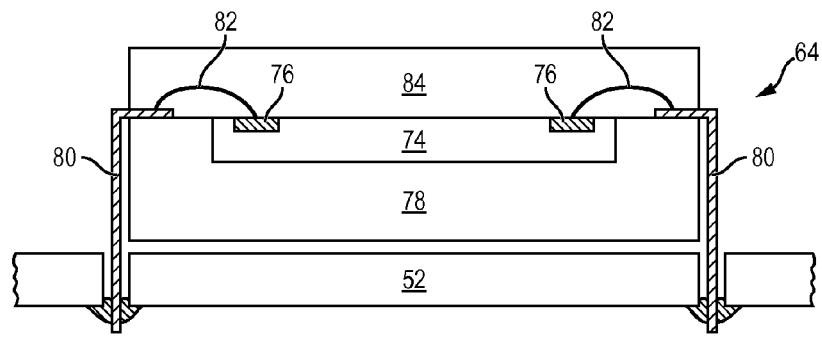
FIGS. 2a-2c illustrate further detail of the semiconductor packages mounted to the PCB.
Figure 2B:
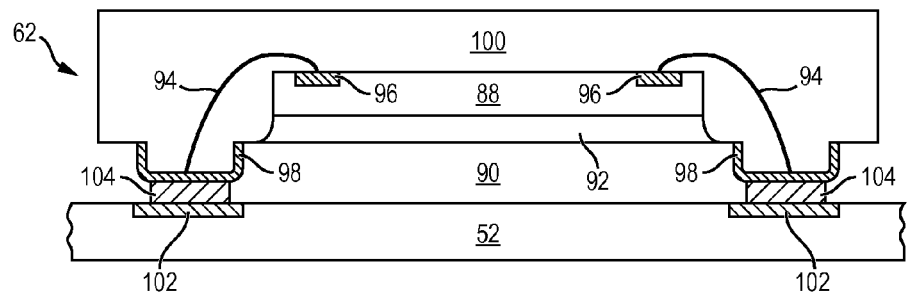
Figure 2C:
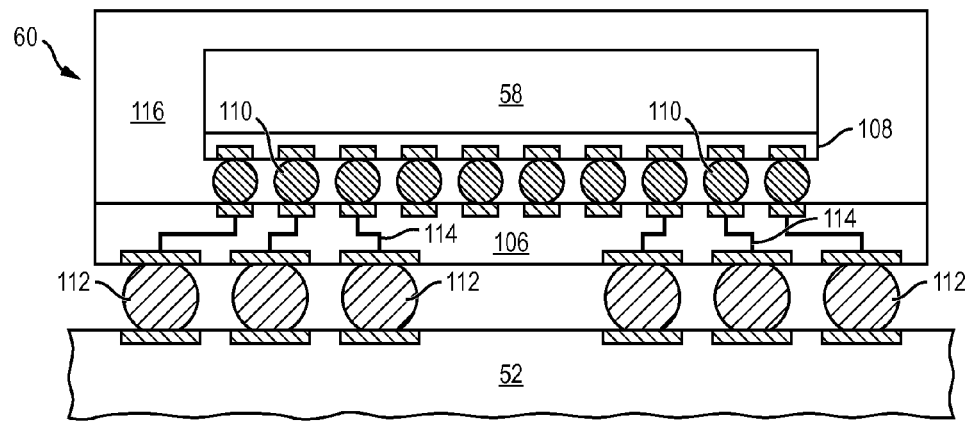

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3F:
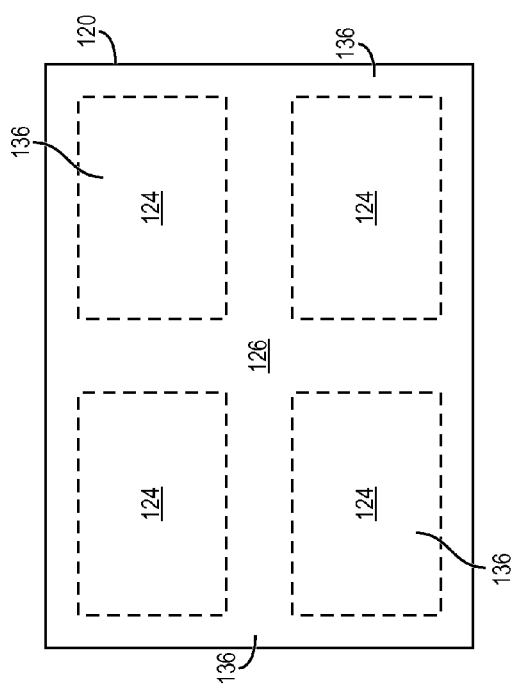

FIGS. 3a-3i illustrate, in relation to FIGS. 1 and 2a-2c, a process of forming a temporary protective layer over an uneven insulating layer to planarize a semiconductor die and protect a die edge during singulation. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. In one embodiment, conductive layer 132 extends above active surface 130 by 0.6 micrometers (μm) or more. Conductive layer 132 operates as contact pads electrically connected to the circuits on active surface 130.

In FIG. 3c, an insulating or passivation layer 134 is conformally applied over active surface 130 and conductive layer 132 using PVD, CVD, screen printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), polyimide, polybenzoxazoles (PBO), polymer dielectric material, or other material having similar insulating and structural properties. In one embodiment, insulating layer 134 has a thickness greater than 0.6 μm. The insulating layer 134 is noted as having a first portion 134a over active surface 130 and second portion 134b over conductive layer 132. The second portion 134b has a high topology with respect to active surface 130 due to the conformal application of insulating layer 134 over conductive layer 132. Accordingly, insulating layer 134 generally has an uneven topology or non-planar surface. A portion of insulating layer 134b is removed to expose conductive layer 132, as shown in FIG. 3d. A portion of insulating layer 134b remains over conductive layer 132, causing the uneven topology or non-planar surface of insulating layer 134.

In FIG. 3e, a blanket temporary protective planarization layer 136 is formed over insulating layer 134 and conductive layer 132 while in wafer form using screen printing, spin coating, spray coating, and lamination. After depositing temporary protective planarization layer 136, additional treatment, such as UV exposure and heat process, can be applied to provide necessary adhesion and mechanical properties. The temporary protective planarization layer 136 contains one or more layers of photoresist, liquid coating material, dry film, polymer film, polymer composite, or other material having properties of compliance, structure support, planarization capability, thermal stability under 110-160° C. for 5 to 120 minutes, and easy strip after encapsulating process. Protective planarization layer 136 is a temporary or sacrificial layer used to planarize the uneven topology of insulating layer 134. The temporary protective planarization layer 136 fills in around the uneven portions of insulating layer 134 to make a planar surface 135. In one embodiment, temporary protective planarization layer 136 is 5 to 25 μm in thickness.

Figure 3G:
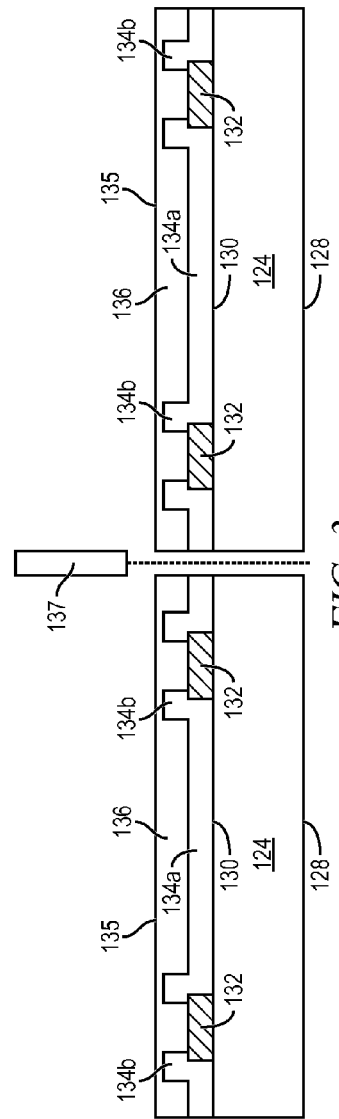

In one embodiment, temporary protective planarization layer 136 covers the entire surface of semiconductor wafer or substrate 120 without patterning, including semiconductor die 124 and saw streets 126, as shown in FIG. 3f. In FIG. 3g, semiconductor wafer 120 is singulated through insulating layer 134, temporary protective planarization layer 136, and saw street 126 using a saw blade or laser cutting tool 137 into individual semiconductor die 124.

Figure 3I:
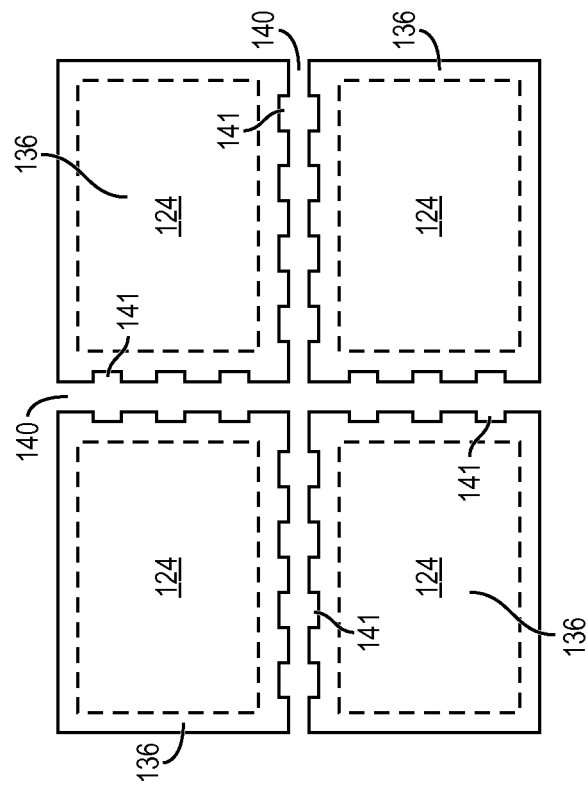
Figure 3H:
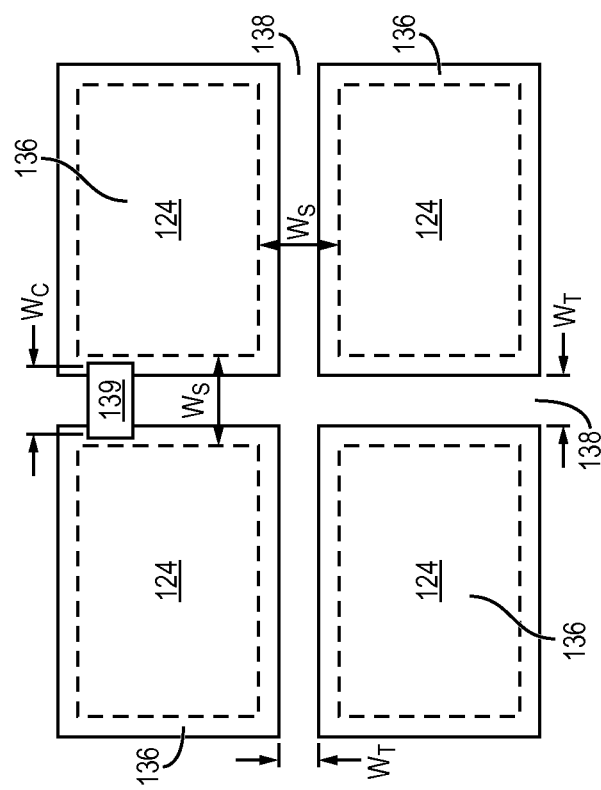

Alternatively, temporary protective planarization layer 136 is patterned to have trench or groove 138 formed over saw streets 126, as shown in FIG. 3h. The width of trench 138 ($W_T$) is less than the width of saw streets 126 ($W_S$), e.g., $W_T$ is made 10 μm less than $W_S$, with temporary protective planarization layer 136 overlapping saw streets 126 by at least 5 μm on each side. The width of saw blade or laser cutting tool 137 is shown as dimension $W_C$. If a conductive layer 139 is formed over saw street 126, then $W_T$ is made 10 μm less than a width of the widest portion of conductive layer 139, with temporary protective planarization layer 136 overlapping conductive layer 139 by at least 5 μm on each side.

A laser can be used to form trench or groove 138 in saw street 126 by removing metal, insulating material, and base semiconductor material with 2-7 passes. The laser reduces cracking of the insulating material, particularly for low dielectric constant (k) material, which can occur during mechanical dicing with saw blade or cutting tool 137. The temporary protective planarization layer 136 is deposited over saw street 126 prior to laser excitation. Protective planarization layer 136 provides for convenient control of the dielectric thickness for additional protection of semiconductor die 124 in reliability testing. In addition, temporary protective planarization layer 136 helps to prevent the die shift and flying die issue in late encapsulating process in FIG. 4c. A thick temporary protective planarization layer 136 also helps to prevent wafer surface from dicing dust blasting and damage in mechanical dicing process.

FIG. 3i shows an alternate pattern of openings 140 with notches 141. In any case, temporary protective planarization layer 136 protects the kerf edge of semiconductor die 124 from chipping and cracking, as well as suppressing metal burring and delamination along saw street 126 or edge of the die, during singulation.

FIGS. 4a-4j illustrate, in relation to FIGS. 1 and 2a-2c, a process of forming a WLCSP with the semiconductor die having the sacrificial protective layer to planar uneven surfaces. FIG. 4a shows a portion of substrate or carrier 142 containing temporary or sacrificial base material such as steel, iron alloy, silicon, polymer, beryllium oxide, or other suitable low-cost, rigid material for structural support. An interface layer or double-sided tape 144 is formed over carrier 142 as a temporary adhesive bonding film or etch-stop layer. In one embodiment, interface layer 144 is thermal or light releasable.

Semiconductor die 124 from FIGS. 3a-3i is positioned over and mounted to carrier 142 using a pick and place operation. FIG. 4b shows semiconductor die 124 mounted to carrier 142 with planar surface 135 of temporary protective planarization layer 136 oriented toward interface layer 144 and carrier 142. Planar surface 135 of temporary protective planarization layer 136 enhances the adhesion or bonding strength of semiconductor die 124 to interface layer 144 by increasing the effective contact surface area and minimizing void forming between the surface of semiconductor die 124 and interface layer 144. Carrier 142 extends beyond the dimensions shown in FIG. 4b for a wafer-level multi-die attachment. Many semiconductor die 124 can be mounted to carrier 142.

In FIG. 4c, an encapsulant or molding compound 146 is deposited over semiconductor die 124 and interface layer 144 with temporary protective planarization layer 136 present using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

In FIG. 4d, carrier 142 and interface layer 144 are removed by chemical etching, mechanical peel-off, CMP, mechanical grinding, thermal bake, laser scanning, or wet stripping to expose temporary protective planarization layer 136 and encapsulant 146.

The temporary protective planarization layer 136 is removed by peeling, as shown in FIG. 4e. Alternatively, temporary protective planarization layer 136 can be removed with deionized (DI) water spray and rinse or by solvent or chemical stripping. Temporary protective planarization layer 136 provides a number of advantageous features for semiconductor die 124, including reducing die edge chipping and cracking during wafer dicing, reducing flying die during encapsulation, reducing conductive bur formation during wafer dicing, easy control over dielectric thickness, and reducing dust damage on active surface 130 during wafer dicing.

In another embodiment, continuing from FIG. 4d, backgrinding tape 150 is applied to encapsulant 146 and temporary protective planarization layer 136, as shown in FIG. 4f. A portion of surface 152 of encapsulant 146 is removed by grinder 154 to planarize the encapsulant and expose back surface 128 of semiconductor die 124. Temporary protective planarization layer 136 is then removed with backgrinding tape 150 after the grinding operation, leaving back surface 128 of insulating layer 134 and conductive layer 132 exposed, as shown in FIG. 4g.

In FIG. 4h, an insulating or passivation layer 156 is formed over surface 158 of encapsulant 152, opposite surfaces 128 and 152, using PVD, CVD, screen printing, spin coating, spray coating, sintering or thermal oxidation. The insulating layer 156 contains one or more layers of polyimide, benzocyclobutene (BCB), PBO, low temperature (<280° C.) curing polymer dielectric, or other material having similar insulating and structural properties. A portion of insulating layer 156 is removed to expose conductive layer 132.

In FIG. 4i, an electrically conductive layer or redistribution layer (RDL) 160 is formed over insulating layer 156 and conductive layer 132 using a patterning and metal deposition process such as PVD, CVD, sputtering, electrolytic plating, and electroless plating. Conductive layer 160 can be one or more layers of Al, Cu, Ti/Cu, TiW/Cu, Sn, Ni, Au, Ag, or other suitable electrically conductive material. Conductive layer 160 is electrically connected to conductive layer 132.

An insulating or passivation layer 162 is formed over insulating layer 156 and conductive layer 160 using PVD, CVD, screen printing, spin coating, spray coating, sintering or thermal oxidation. The insulating layer 162 contains one or more layers of polyimide, BCB, PBO, low temperature (<280° C.) curing polymer dielectric, or other material having similar insulating and structural properties. A portion of insulating layer 162 is removed to expose conductive layer 160. Additional RDL layers, including conductive and insulation layers, may be built up as per design requirements.

In FIG. 4j, an electrically conductive bump material is deposited over the exposed conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 164. In some applications, bumps 164 are reflowed a second time to improve electrical contact to conductive layer 160. The bumps can also be compression bonded to conductive layer 160. Bumps 164 represent one type of interconnect structure that can be formed over conductive layer 160. The interconnect structure can also use stud bump, micro bump, or other electrical interconnect.

Figure 5:
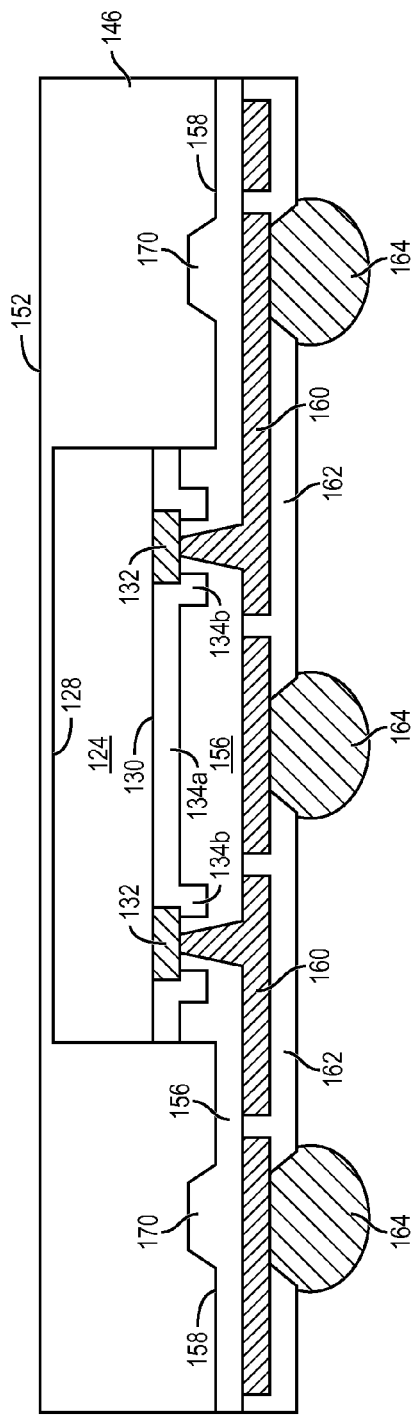
FIG. 5 illustrates a WLCSP with a shallow cavity formed in the encapsulant over the RDL and bumps.

FIG. 5 shows another embodiment, similar to FIG. 4j, with shallow cavity or channel 170 formed in encapsulant 146 under conductive layer 160 and bumps 164. The shallow cavity 170 can be formed by laser drilling encapsulant 146 in FIG. 4d to a depth of 5-50 μm, prior to removal of temporary protective planarization layer 136. The shallow cavity 170 provides dumping support in drop test (DT) and temperature cycling on board (TCoB) test. Shallow cavity 170 also enhances repassivation with insulating layer 156.

Figure 6:
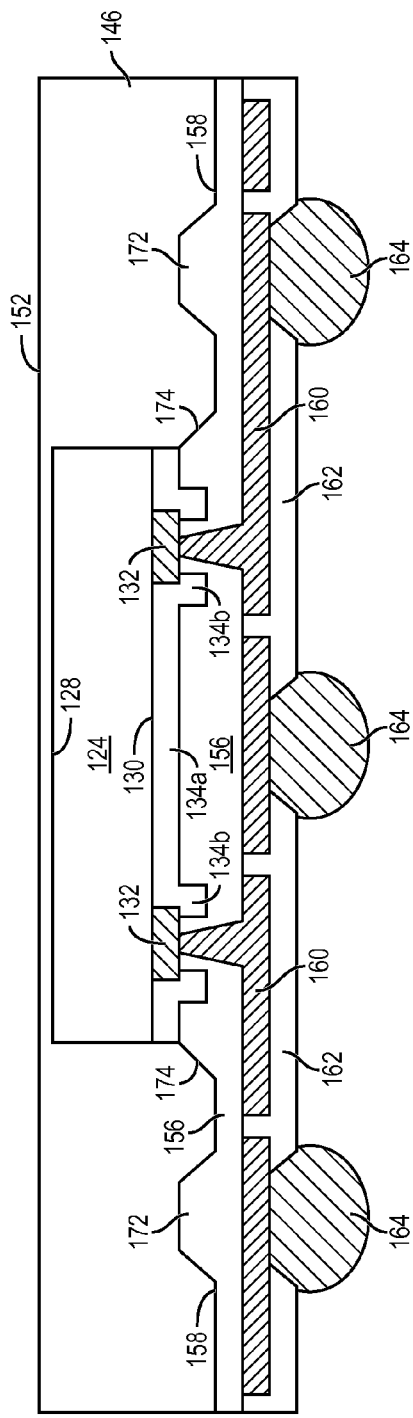
FIG. 6 illustrates a WLCSP with a shallow circle cavity formed in the encapsulant over the RDL and bumps and encapsulant trim around the semiconductor die.

FIG. 6 shows another embodiment, similar to FIG. 4j, with shallow circle cavity or channel 172 formed in encapsulant 146 around semiconductor die 124 under conductive layer 160 and bumps 164. The shallow circle cavity 172 can be formed by laser drilling encapsulant 146 in FIG. 4d to a depth of 5-50 μm, prior to removal of temporary protective planarization layer 136. The shallow circle cavity 172 provides dumping support in DT and TCoB test. In addition, the laser can trim edge 174 of encapsulant 146 around semiconductor die 142 in FIG. 4d, prior to removal of temporary protective planarization layer 136.

Figure 7:
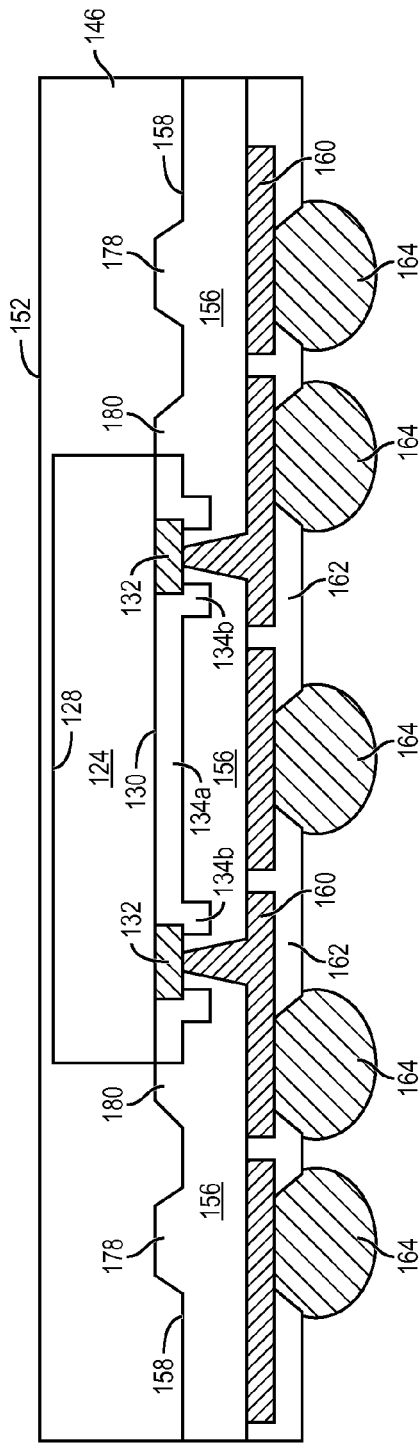
FIG. 7 illustrates a WLCSP with shallow cavities formed in the encapsulant over the RDL and bumps and around the semiconductor die.

FIG. 7 shows another embodiment, similar to FIG. 4j, with shallow cavity or channel 178 formed in encapsulant 146 around semiconductor die 124 under conductive layer 160 and bumps 164. In addition, shallow cavity or channel 180 is formed in encapsulant 146 around the edge of semiconductor die 124. The shallow cavities 178-180 can be formed by laser drilling encapsulant 146 in FIG. 4d to a depth of 5-50 μm, prior to removal of temporary protective planarization layer 136. The shallow cavities 178-180 provide dumping support in DT and TCoB test.

Figure 8:
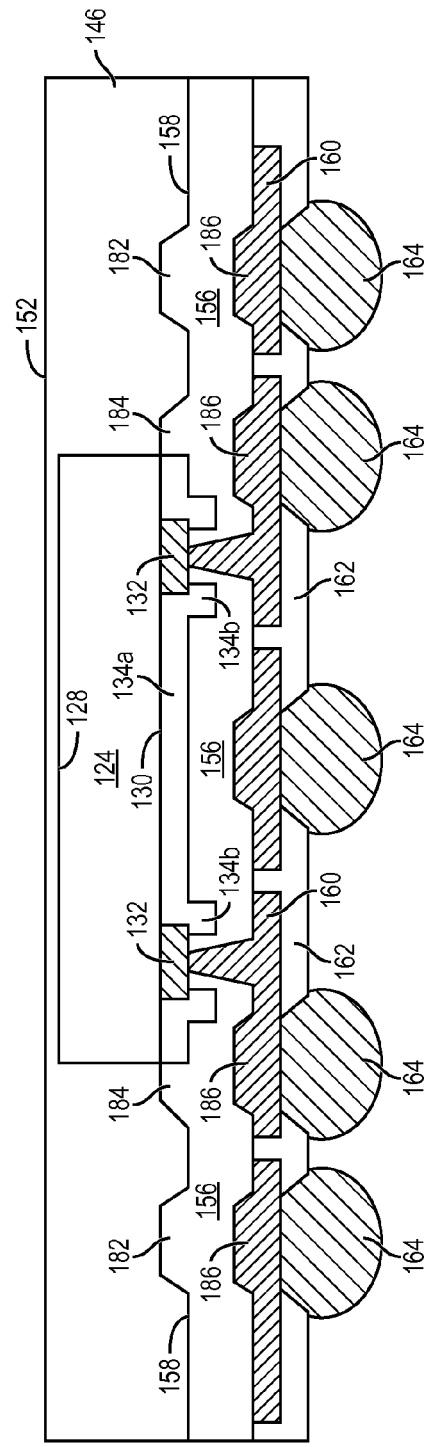
FIG. 8 illustrates a WLCSP with shallow cavities formed in the encapsulant and thick RDL under the cavities.

FIG. 8 shows another embodiment, similar to FIG. 4j, with shallow cavity or channel 182 formed in encapsulant 146 around semiconductor die 124 under conductive layer 160 and bumps 164. In addition, shallow cavity or channel 184 is formed in encapsulant 146 around the edge of semiconductor die 124. The shallow cavities 182-184 can be formed by laser drilling encapsulant 146 in FIG. 4d to a depth of 5-50 μm, prior to removal of temporary protective planarization layer 136. The shallow cavities 182-184 provide dumping support in DT and TCoB test. The insulating layer 156 has sufficient thickness to form dishing over shallow cavities 182 without fully planarizing the substrate surface. Conductive layer 160 has a thicker dome-shaped portion 186 under shallow cavities 182 and 184.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a semiconductor die;
    forming an insulating layer including a non-planar surface covering an entire surface of the semiconductor die;

forming a protective layer over the semiconductor die and covering the entire surface of the semiconductor die;
removing the protective layer; and
forming an interconnect structure over the semiconductor die.

2. The method of claim 1, further including depositing an encapsulant over the semiconductor die prior to removing the protective layer.

3. The method of claim 2, further including forming a first cavity in the encapsulant around the semiconductor die.

4. The method of claim 3, further including disposing an insulating layer in the first cavity.

5. The method of claim 4, further including forming a second cavity in the insulating layer over the first cavity.

6. A method of making a semiconductor device, comprising:
providing a semiconductor die;
forming a protective layer over the semiconductor die;
depositing an encapsulant over the semiconductor die; and
forming a first cavity in the encapsulant adjacent to the semiconductor die.

7. The method of claim 6, wherein the protective layer includes a non-planar surface oriented toward the semiconductor die and a planar surface oriented away from the semiconductor die.

8. The method of claim 6, further including forming an insulating layer including a non-planar surface over the semiconductor die.

9. The method of claim 6, further including planarizing the encapsulant with a surface of the semiconductor die.

10. The method of claim 6, further including disposing an insulating layer in the first cavity.

11. The method of claim 10, further including forming a second cavity in the insulating layer.

12. A method of making a semiconductor device, comprising:
providing a semiconductor die;
forming a first insulating layer over the semiconductor die;
forming a protective layer over the first insulating layer;
depositing an encapsulant over the semiconductor die;
forming a first cavity in the encapsulant around the semiconductor die; and
removing the protective layer.

13. The method of claim 12, further including forming the first insulating layer to include a non-planar surface.

14. The method of claim 13, wherein the protective layer includes a planar surface.

15. The method of claim 12, further including forming a second insulating layer in the first cavity.

16. The method of claim 15, further including forming a second cavity in the second insulating layer.

17. The method of claim 15, further including forming a conductive layer over the second insulating layer.

18. A method of making a semiconductor device, comprising:
providing a semiconductor die;
forming a protective layer including a non-planar surface oriented toward the semiconductor die and a planar surface oriented away from the semiconductor die; and
depositing an encapsulant over the semiconductor die and coplanar with the planar surface of the protective layer.

19. The method of claim 18, further including forming an insulating layer including a non-planar surface over the semiconductor die.

20. The method of claim 18, further including planarizing the encapsulant with a surface of the semiconductor die.

21. The method of claim 18, further including forming a cavity in the encapsulant adjacent to the semiconductor die.

22. The method of claim 21, further including forming an insulating layer in the cavity.

23. The method of claim 18, further including forming the protective layer extending completely across the semiconductor die.

24. The method of claim 6, further including forming a conductive bump over the encapsulant and aligned with the first cavity.

25. The method of claim 24, further including forming a conductive layer from the semiconductor die to the conductive bump.

* * * * *